United States Patent [19]

Sunami et al.

[11] Patent Number: 4,860,071
[45] Date of Patent: Aug. 22, 1989

[54] SEMICONDUCTOR MEMORY USING TRENCH CAPACITOR

[75] Inventors: Hideo Sunami, Nishitama; Tokuo Kure, Kokubunji; Atsushi Hiraiwa, Kodaira; Yasuo Wada, Bunkyo, all of Japan

[73] Assignee: Hitachi, Ltd., Tokyo, Japan

[21] Appl. No.: 157,129

[22] Filed: Feb. 10, 1988

Related U.S. Application Data

[63] Continuation of Ser. No. 836,751, Mar. 6, 1986, abandoned.

[30] Foreign Application Priority Data

Mar. 8, 1985 [JP] Japan .................................. 60-44797
May 8, 1985 [JP] Japan .................................. 60-95901

[51] Int. Cl.[4] .................................................. H01L 29/78
[52] U.S. Cl. ........................................ 357/23.6; 357/55; 357/41; 357/56; 365/149; 365/182
[58] Field of Search .................... 357/23.6, 55, 56, 41; 365/149, 182

[56] References Cited

FOREIGN PATENT DOCUMENTS

| 85988 | 8/1983 | European Pat. Off. | ........... 357/23.6 |
|---|---|---|---|
| 108390 | 5/1984 | European Pat. Off. | ........... 357/23.6 |
| 149799 | 7/1985 | European Pat. Off. | ........... 357/23.6 |
| 159824 | 10/1985 | European Pat. Off. | ........... 357/23.6 |
| 57-10973 | 1/1982 | Japan | ........... 357/23.6 |
| 59-222959 | 12/1984 | Japan | ........... 357/23.6 |
| 60-74555 | 4/1985 | Japan | ........... 357/23.6 |
| 60-152059 | 8/1985 | Japan | ........... 357/23.6 |
| 60-253263 | 12/1985 | Japan | ........... 357/23.6 |

Primary Examiner—Joseph E. Clawson, Jr.
Attorney, Agent, or Firm—Antonelli, Terry & Wands

[57] ABSTRACT

A memory is disclosed which uses a microcapacitor as a data storage portion. The microcapacitor uses as its main electrode surface the side wall of a first trench formed on a semiconductor substrate, and is fabricated by diffusing an impurity from a second diffusion trench adjacent to the first trench by setting the shapes and diffusion conditions of the first and second trenches so that the tip of the diffusion layer reaches the side wall of the first trench. The capacitor uses the diffusion layer as one of the electrodes. An insulating film is deposited on the side wall of the first trench and an electrode as the other electrode of the capacitor is deposited on this insulating film. The memory can reduce a leakage current between memory cells by connecting the capacitor to a transistor fabricated in the same semiconductor substrate, and can be formed within a limited space.

11 Claims, 9 Drawing Sheets

SEMICONDUCTOR MEMORY USING TRENCH CAPACITOR

This application is a continuation of application Ser. No. 836,751, filed on Mar. 6, 1986, now abandoned.

BACKGROUND OF THE INVENTION

This invention relates generally to dynamic random access memories (hereinafter referred to as "dRAM"), and more particularly to a structure which is suitable for obtaining large capacitance by use of a very small memory cell. This invention relates further to a trench capacitor formed in a semiconductor and to a method suitable for fabricating a very small capacitor.

As disclosed in Japanese Patent Laid-Open No. 154256/1983, a conventional trench capacitor is formed by first forming a $n^+$-layer on a substrate and then isolating this $n^+$-layer by a trench to obtain individual capacitors. If this trench is used for the purpose of device isolation, too, the $n^+$-layer must not be formed at part of the trench, that is, in a region in which an MOS transistor is to be formed. In other words, one trench must be devided into a region in which the $n^+$-layer is formed and a region in which it is not formed, and this leads to a serious problem.

Conventional memory cells use the side walls of a trench formed in an Si substrate as capacitors as disclosed in U.S. Pat. No. 4,397,075. A leakage current flows through adjacent capacitors and a minimum spacing between them is set in accordance with a structure or with an impurity concentration of the Si substrate. For these reasons, it has been difficult to fabricate a very small cell.

Japanese Pat. Laid-Open No. 137245/1983, which was invented by some of the co-inventors of the present invention, proposes a method of reducing this leakage current. However, this prior art technique employs a structure which can not be integrated easily in a high packing (integration) density environment.

SUMMARY OF THE INVENTION

It is an object of the present invention to fundamentally restrict the occurrence of a leakage current between adjacent cells and to provide a very small memory cell.

It is another object of the present invention to provide a method which provides a capacitor trench of an n-type but which prevents a trench region for device isolation from becoming the n-type.

The present invention first forms a trench for device isolation and a capacitor trench. Next, while the trench for device isolation is covered with a mask, $n^+$-type diffusion is effected into the capacitor trench. Thus, a trench capacitor using the longitudinal $n^+$-type layer as an electrode is formed.

In accordance with the present invention, a onetransistor type dRAM memory cell is constituted by use of a capacitor which is formed between a capacitor electrode in an $n^+$-type region formed inside a p-type Si substrate and a plate encompassing the capacitor electrode. Since a leakage current between adjacent cells is not primarily dependent upon the distance between the capacitors, a very small memory cell can be formed.

These and other objects and features of the present invention will become more apparent from the following description to be taken in conjunction with the accompanying drawings.

DESCRIPTION OF THE PREFERRED EMBODIMENTS

EMBODIMENT 1

Figure 1:
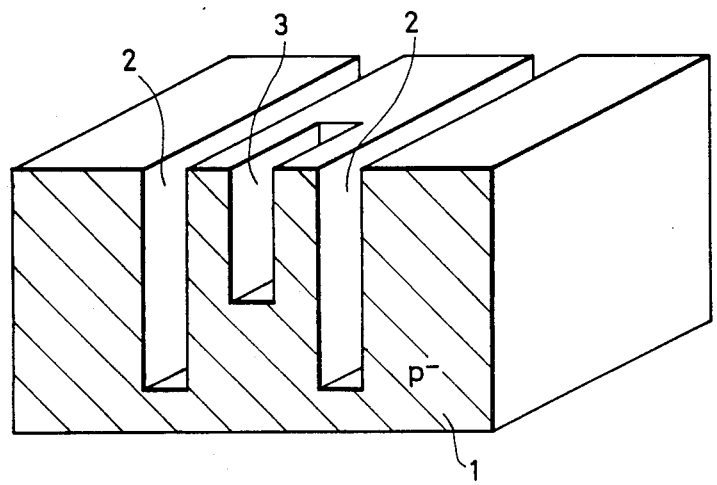
FIGS. 1 to 3 are schematic sectional views showing step-wise a fabrication process of a first embodiment of the present invention.
Figure 2:
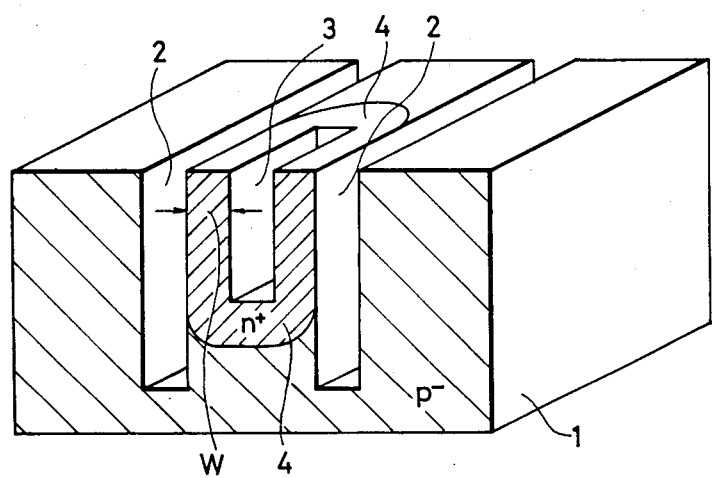

The first embodiment of the present invention will now be described with reference to FIG. 1.

First of all, isolation trenches 2 and a diffusion trench 3 are separately formed on a p-type semiconductor substrate 1 (which is supposed to be made of single crystalline silicon for purpose of description) using a photolithographic technique and a dry etching technique using a gas such as $CF_4$. It is hereby assumed that the diffusion trench 3 is shallower than the isolation trenches 2 because devices can be more easily isolated in such a case.

The isolation trenches 2 can be made deeper than the diffusion trench 3 by, for example, changing the etching conditions, particularly an etching time. Needless to say, both kinds of trenches can be formed by the same process, and they will have the same depth in such a case, as will be illustrated in the later-appearing embodiments.

Then, an impurity such as phosphorus (P), arsenic (As) or anthimony (Sb) is diffused from the diffusion trench 3 and suitable heat-treatment is carried out so that the spacing W between both trenches is filled up with an $n^+$-diffused layer 4. Generally, the scale for diffusion is given by the following equation:

$$W = \sqrt{D(T) \cdot t}$$

where D (T) is a diffusion coefficient at a diffusion temperature T, and t is a diffusion time.

The condition described above can be satisfied by selecting suitable values for D, (T) and t. Each of the impurities described above can be diffused in the following manner. Phosphorus (P) can be diffused by introducing a suitable quantity of $POCl_3$ gas into a thermal diffusion furnace at 800° to 1,200° C. Sb can be diffused by heating and vaporizing $Sb_2O_3$ and introducing the vapor into the thermal diffusion furnace. Since As becomes dangerous when converted to a gas, so-called "arsenic glass" consisting of $SiO_2$ which contains As and is deposited by CVD is deposited on the inner wall of the diffusion trench 3 so as to diffuse As from this glass.

Figure 3:
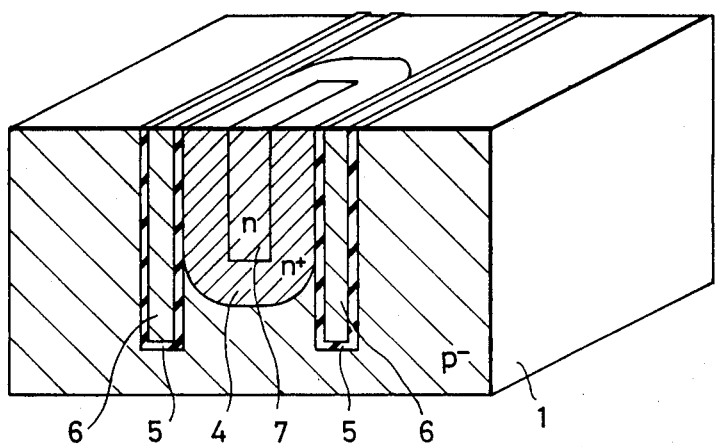

Thereafter, a single layer of $SiO_2$ or an $Si_3N_4$ film or an insulating film of a film of such a layer is deposited on the inner wall of each isolation trench 2 as shown in FIG. 3, and then a plate 6 consisting of polycrystalline Si is buried. It may of course consist of other conductor metals or silicides.

The trench 3 used for diffusion is buried once again by polycrystalline Si or single crystalline Si to form a refilled layer 7. There is thus obtained a flat diffused layer 4.

According to the method described above, the n-type diffused layer 4 can form a capacitor with the plate 6 while interposing each insulation film 5 between them.

Figure 4:
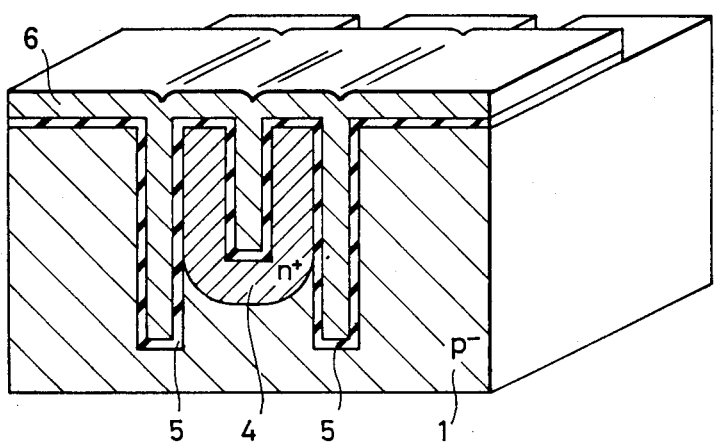
FIG. 4 is a schematic sectional view showing a partially modified example of the first embodiment.

It is also possible to form a capacitor by depositing the insulating film 5 and burying the plate 6 without refilling the diffusion trench 3, as shown in FIG. 4. Such a method can form a capacitor having a greater capacitance value than that of the structure shown in FIG. 3, since the capacitance per unit flat area can be increased.

EMBODIMENT 2

Next, the second embodiment of the present invention will be described.

In the first embodiment given above, the isolation trenches 2 and the diffusion trench 3 are formed by the separate mask processes. In such a case, mask registration becomes necessary and W will change. Therefore, miniaturization of the device becomes difficult.

This problem becomes more critical when further steps are taken toward miniaturization of the device.

Figure 5:
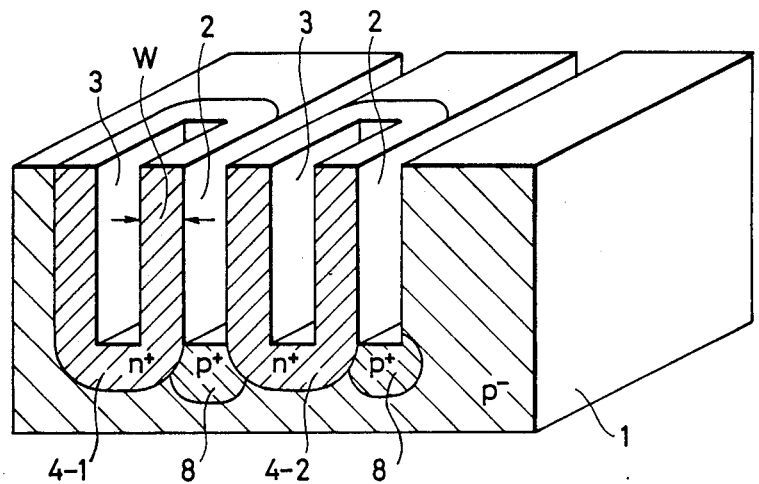
FIG. 5 is a schematic sectional view showing the first production process of a second embodiment of the present invention.

FIG. 5 shows the second embodiment of the present invention. The structure shown in the drawing eliminates the problem described above. In this second embodiment, the diffusion trench 3 and the isolation trenches 2 are simultaneously formed by one photomask, and hence the change of W can be substantially neglected. Then, the device isolation trenches 2 are covered with $SiO_2$ or $Si_3N_4$ and diffusion of an n-type impurity is effected from the diffusion trench 3. Since the difused layer extends downwards also from the bottom of the trench, the adjacent diffused layers 4-1 and 4-2 face each each other at their bottoms with the absence of the device isolation trench 2 between them. In this case, a leakage current will flow between the diffused layers 4-1 and 4-2 due to an impressed voltage to the diffused layer 4 or depending upon the impurity concentration of the substrate 1. If this problem occurs, a channel stopper 8 having the same conductivity type as that of the substrate and a high impurity concentration may be formed by implanting boron ions.

Alternatively, the structure shown in FIGS. 1 through 4 may be realized eventually by dry-etching once again the isolation trenches 2 while covering the diffusion trench 3 to increase their depth.

Thereafter, the insulation film 5 and the plate 6 are formed in the same way as in the first embodiment shown in FIG. 3 to obtain an intended capacitor.

As described above, since the present invention can form a trench capacitor having a small half surface area and yet a large capacitance, the present invention can be applied to all types of integrated circuits which use capacitors.

EMBODIMENT 3

The third embodiment of the present invention relates to a dynamic random access memory (hereinafter referred to as "dRAM") of a one-transistor one-capacitor type.

Figure 6:
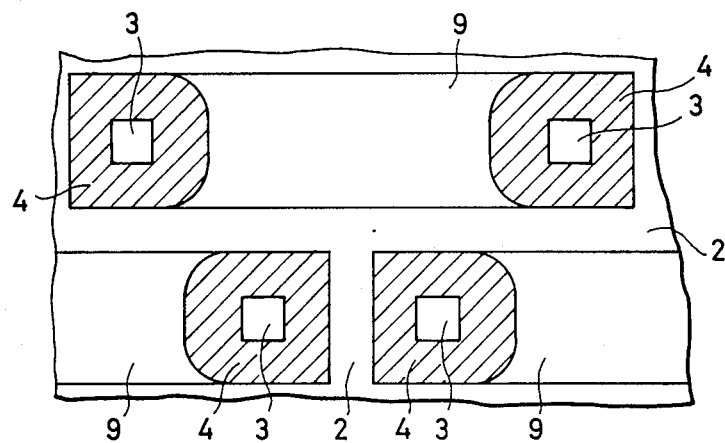
FIGS. 6 to 8 are plan and sectional views showing a third embodiment of the present invention.

As shown in the plan view of FIG. 6, the device isolation trenches 2 and the diffusion trench 3 are first formed in the same way as in the foregoing embodiments, and an n-type impurity is diffused from the diffusion trench 3 to obtain the diffused layer 4. A memory cell-forming region 9 is encompassed by the isolation trenches 2.

Figure 7:
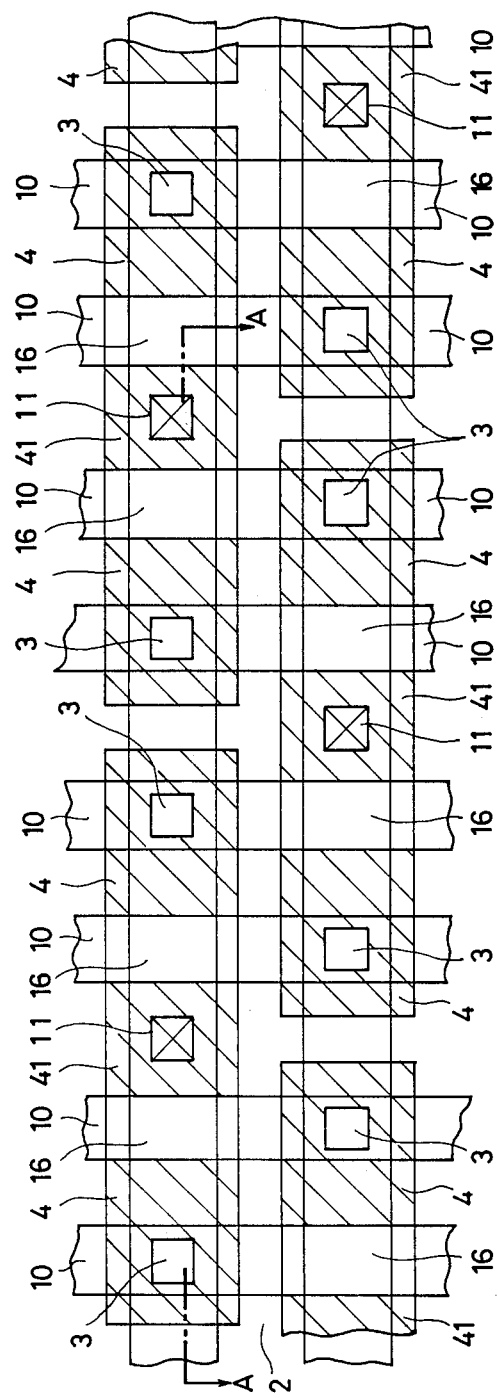
Figure 8:
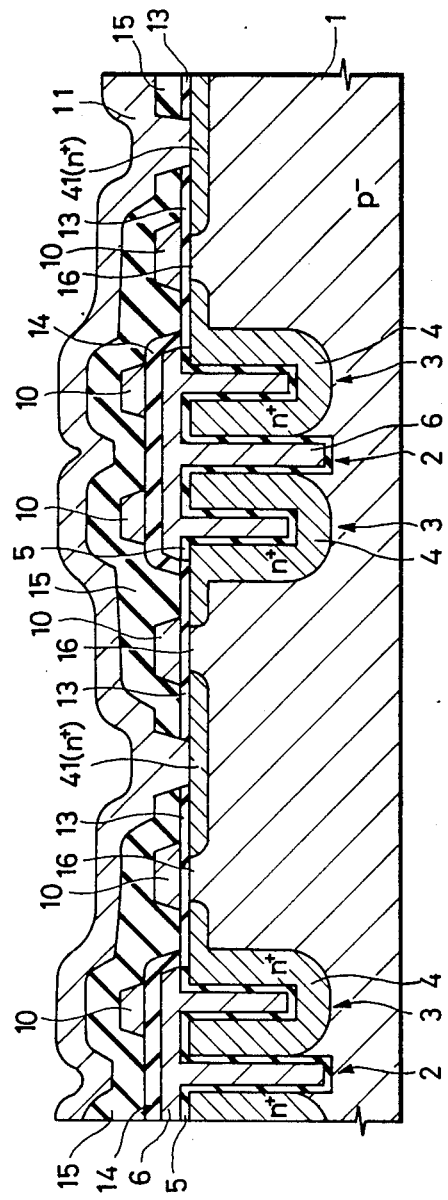

Thereafter, the insulating film 5 is deposited as shown in the plan view of FIG. 7 and the sectional view of FIG. 8, and this polycrystalline silicon plate 6 is oxidized to form an insulating film 14. Silicon is then oxidized to form a gate insulating film 13 to form a word line 10 represented by polycrystalline Si or metal silicide. When ion implantation is made, a new n-type diffused layer 41 is formed on the surface of the Si substrate while leaving the portion covered with the word line 10 and the plate 6. An intermediate insulating film 15 such as $SiO_2$ is deposited by CVD. After a contact hole 11 is formed on this intermediate insulating film 15, a bit line consisting of metal such as Al or silicide is formed. In this manner, a one-transistor one-capacitor type dRAM cell can be obtained. Since the capacitor is formed between the plate 6 and the n-type diffused layer 4, the potential of the plate can be fixed to each potential. Ordinarily, it is fixed to a ground potential to minimize any fluctuation.

The memory cells shown in FIGS. 6 to 8 are arranged in such a manner as to be alternately deviated from one another, and this arrangement is a so-called "folded bit line arrangement". In accordance with this folded bit line arrangement, the channel region 16 below the word line 10 and the diffused layer 4 face each other at the inner wall portion of the isolation trench 2 as shown in FIG. 7. Particularly when the trench width is below 1 μm, it is generally extremely difficult to render one of the surfaces the n-type with the other being left the p-type from the side of the isolation trench 2.

Figure 9:
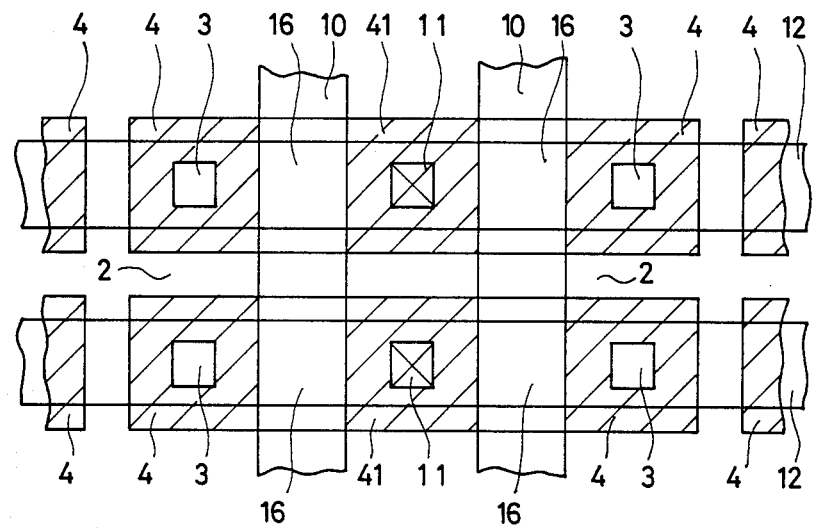
FIG. 9 is a plan view when an open bit line structure is employed.

In accordance with an open bit arrangement which forms a pair with the folded bit line arrangement, the channel 16 and the n-type diffused layer 4 do not face each other at the inner wall portion of the isolation trench 2, as shown in FIG. 9. Therefore, this arrangement is easier to practice than the former. The method of the present invention which extends the n-type diffused layer 4 from the inner wall is extremely effective when the trench width is as small as 1 μm.

EMBODIMENT 4

Figure 10:
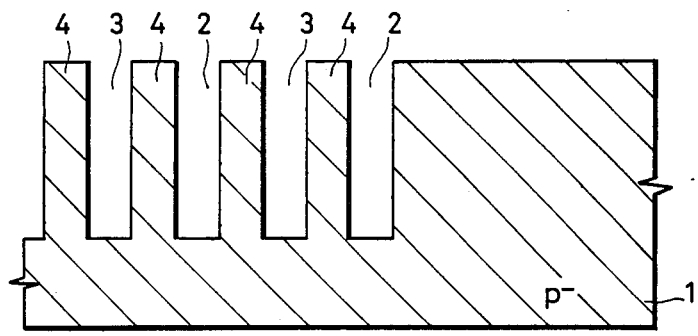
FIGS. 10 to 16 are sectional and plan views showing a fourth embodiment of the present invention.

Next, the fourth embodiment of the present invention will be described. As shown in FIG. 10, isolation trenches 2 and a diffusion trench 3, each being 4 μm deep, are formed on a p-type 10 Ω-cm Si substrate 1 by ordinary dry-etching using a gas such as $CF_4$. Each diffusion trench 3 is encompassed therearound by the isolation trenches 2 and the encompassed portion defines a protruding pole 4. Then, the portions other than the diffusion trench 3 are covered with an $Si_3N_4$ film or an $SiO_2$ film, and are heated to about 1,000° C. in a $POCl_3$ gas to obtain an $n^+$-type diffused layer as a capacitor electrode 6. This $n^+$-layer is formed until it comes into contact with the isolation trench 2.

Figure 11:
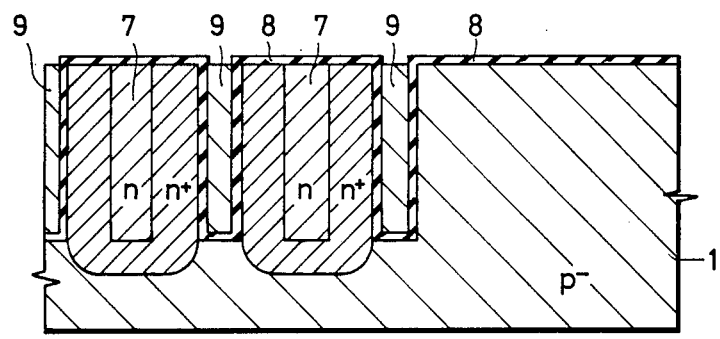

Thereafter, the diffusion trench 3 is refilled by polycrystalline or single crystalline Si by CVD as shown in FIG. 11, thereby forming a refilled layer 7. An about 5 to 100 nm thick capacitor insulating film 8 consisting of a single layer film of $Si_3N_4$ or $SiO_2$ or their laminate film is deposited and the plate 9 of the polycrystalline Si is buried into the isolation trench 3. After polycrystalline Si is deposited to the entire portion, the entire surface is dry-etched, thereby attaining the state shown in FIG. 11.

Figure 12:
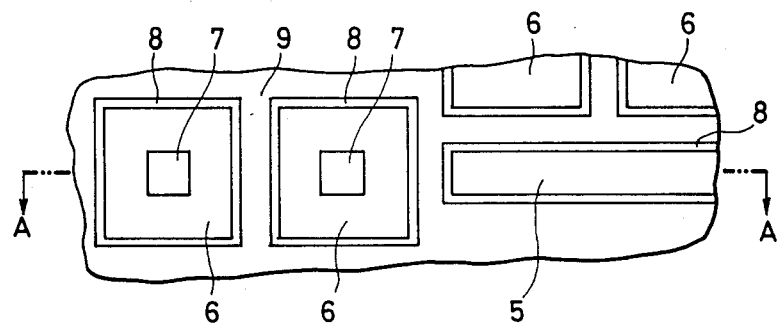

FIG. 12 is a plan view of the device formed by the steps described above. The n+-layer capacitor electrode 6 is encompassed by the plate 9. (FIG. 11 is a sectional view taken along line A—A of the plan view of FIG. 12.) An active region 5, in which an access transistor is to be formed later, is formed also in such a manner as to be encompassed by the isolation trenches 9.

Figure 13:
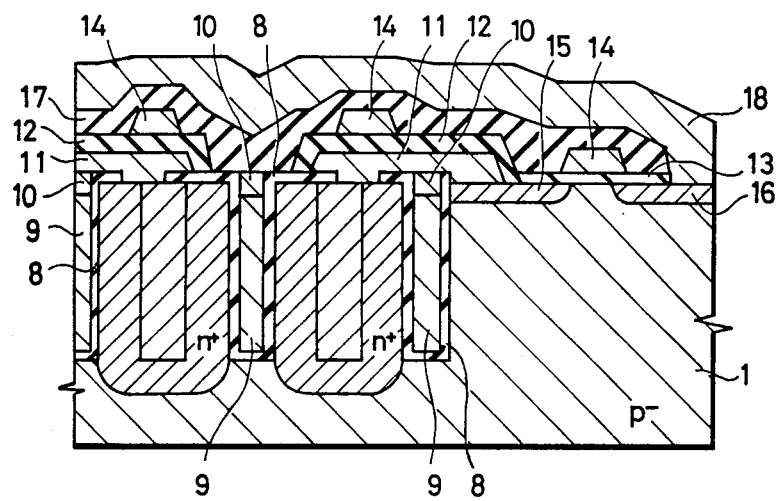

Thereafter, the polycrystalline Si plate 9 is oxidized as shown in FIG. 13, and the surface of the plate 9 is covered with a plate insulating film 10. Furthermore, a hole is bored at a predetermined portion of the capacitor insulating film 8 and a polycrystalline Si wiring 11 is connected to the capacitor electrode 6 and a part of the active region 5. This wiring 11 is oxidized to form a 200 nm thick insulating film 12. Furthermore, a 20 nm thick gate insulating film 13 is formed by thermal oxidation to form a gate 14. This gate 14 serves a part of a word line of a memory.

Next, As ions are implanted to form source and drain 16, 15 each consisting of an n+-layer, and a 500 nm thick intermediate insulating film 17 represented by PSG is deposited. A contact hole is formed on the source 16 and a bit line 18 of Al electrode is formed.

Figure 14:
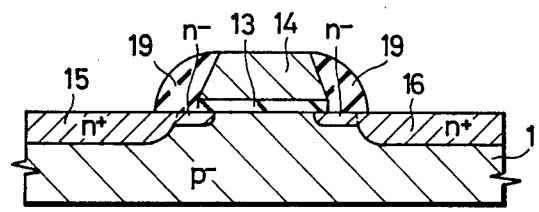

The structure constituted by the source 16, the drain 15 and the gate 14 shown in FIG. 13 is a structure of an access transistor that has been widely used in the past. However, a so-called LDD (lightly doped drain) transistor which reduces the thickness at the end portions of the source 16 and drain 15 by utilizing a side wall spacer 19 shown in FIG. 14 can also be used in order to improve the source-drain breakdown voltage of the transistor.

Figure 15:
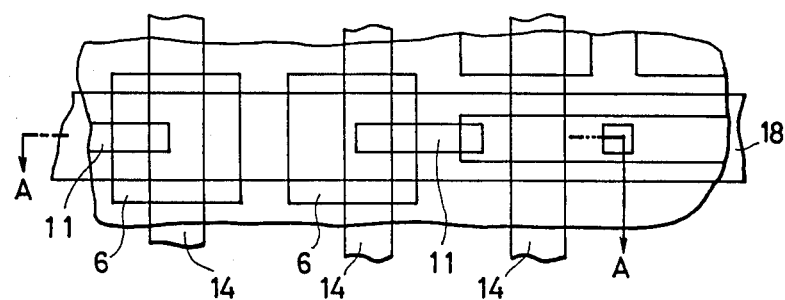

The sectional view of FIG. 13 is taken along line A—A of the plan view of FIG. 15, and the layout of the memory cell shown in FIG. 15 is of the socalled folded bit line system, where two word lines 14 cross on one memory cell.

The memory cell of the present invention stores charge as a signal in the capacitor consisting of the capacitor electrode 6 and the plate 9 encompassing the electrode 6. Therefore, the capacitor surface lies around the electrode 6, and the capacitance can be increased by increasing the depth of trench. In order words, the capacitance does not depend upon the planar area of the memory cell in principle.

In accordance with the conventional memory cell structure, a depletion layer extends inside the Si substrate, and the structure is extremely susceptible to noise due to electrons of around 200 fc, which are generated by α-particles which are incident into the Si substrate.

Figure 16:
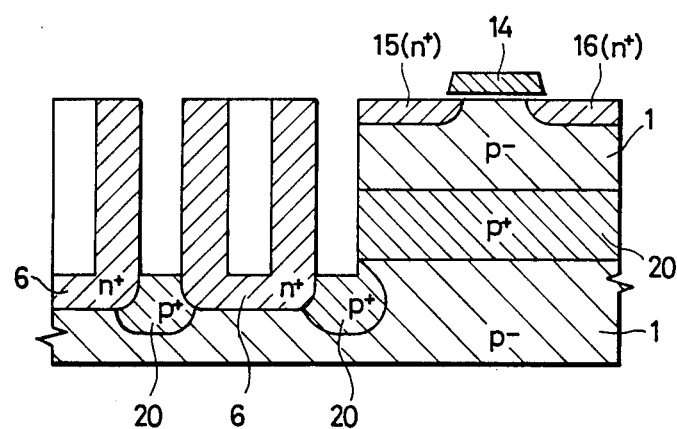

In contrast, in the structure of the present invention, the depletion layer extends only below the capacitor electrode 6 and the structure of the invention is highly resistant to the α-particle-generated noise. As shown in FIG. 16, too, if boron ions are implanted from the isolation trench 2 to form a p+-type layer 20, it serves as the barrier for the electrons generated by the α-particles and can reduce the leakage current between it and the capacitor electrode 6 of another adjacent memory cell, as well.

As also shown in FIG. 16, if the p+-layer 20 is formed by ion implantation of the B ions into a deep portion of the Si substrate, the inflow of α-particle generated electrons into the source 16 and drain 15 of the transistor can be prevented so that the resistance to the α-particle can also be improved. The same effect can be obtained by use of a p/p+ epitaxial substrate obtianed by epitaxially growing a p layer on the p+-type layer before the formation of the memory cell.

In the description given above, one capacitor is formed by encompassing one diffusion trench by the plate. However, a plurality of capacitor electrodes can be formed by first forming an n+-type region by one diffusion trench and then dividing this n+-layer by dry etching into two or more portions. In this case, the number of capacitor electrodes corresponds to the number of division of the n+-type layer. For example, if the structure is fabricated with a minimum dimension of 1 $\mu$m, the diffusion trench 3 is 1 $\mu$m square and the isolation trench 2 encompassing the former is 3 $\mu$m square, so that the minimum capacitor electrode in the layout pattern is 3 $\mu$m square. If this 3 $\mu$m-square capacitor electrode is divided at its center by a 1 $\mu$m-wide pattern, there can be obtained two capacitor electrodes of 3 $\mu$m $\times$ 1 $\mu$m. Therefore, the capacitor electrodes having a dimension substantially equal to the minimum dimension can be formed and hence the invention is effective for miniaturizing the capacitor.

In the description given above, the switching transistor of the dRAM cell used for description is shown formed on the Si substrate, but the present invention can obviously be applied to the case which uses a so-called SOI (Silicon On Insulator) which forms the transistor on an insulating film deposited on the substrate. Therefore, the present invention is not dependent upon the method of forming the switching transistor.

Though the invention illustrated in FIGS. 6 to 8 uses the structure shown in FIG. 4, the present invention can be similarly applied to the buried structure shown in FIG. 3 and is not restricted by the capacitor structure.

The foregoing embodiments deal with the case for purpose of description in which the substrate 1 is of the p-type and the diffused layer 4 is of the n-type, but is is generally easy for semiconductors to reverse the conductivity types. In such a case, the conductivity types of the impurities are all reversed.

In accordance with the present invention, the opposed surfaces of the inner walls of a deep trench can have different conductivity types and different conductivities in a dRAM cell of a folded bit line system, and the present invention provides a great effect for miniaturizing the capacitor and hence, the memory cell.

Furthermore, the present invention can drastically increase the capacitance, which is important for improving the operation stabilitiy of dRAMs, without being restricted by the flat surface area. Therefore, the present invention is extremely advantageous for miniaturizing the memory cells and increasing the scale of the memory. In the case of a capacitor electrode which is 2 $\mu$m in diameter and 5 $\mu$m deep, for example, the capacitance Cs is 108 fF if a 10 nm-thick $SiO_2$ is used as the capacitor insulating film ($Sc = 3.45 \times 10^{-13} 33 \ 2 \times 10^{-4} \pi \times 5 \times 10^{-4} / 10 \times 10^{-7}$ F). In the case of a flat surface having a 2 $\mu$m diameter, the capacitance is only 10.8 fF. ($Cs = 3.45 \times 10^{-13} \times \pi \times (1 \times 10^{-4})^2 / 10 \times 10^7$ F.)

In comparison with the conventional trench capacitor in which the depletion layer extends into the Si substrate, the capacitor electrode of the n+-type layer in the present invention is encompassed by the plate. Therefore, the adverse influence of the noise electrons generated by the α-particles is extremely small and hence, a so-called "soft error rate" can be reduced.

Although the present invention has thus been described in its preferred forms, it is understood that such description is for illustrative purpose only, and that various changes and variations may be made by those skilled in the art without departing from the spirit and scope of the appended claims.

What is claimed is:

1. A semiconductor memory comprising:
   a plurality of word lines, data lines and memory cells that are disposed on a semiconductor substrate of a first conductivity type, wherein said memory cells are arranged in matrix;
   data storage portions formed for each of said memory cells, wherein each of said data storage portions comprises:
      first and second trenches formed in said substrate,
      an impurity doped region having a second conductivity type opposite to said first conductivity type, wherein said impurity doped region is formed in said substrate so as to extend between a side wall of the first trench and a side wall of said second trench,
      at least one insulating film formed on said side walls of said first and second trenches, and
      a plate electrode disposed on said insulating film in both said first and second trenches,
      wherein a first capacitance for said data storage portions is formed by the impurity doped region, a first portion of the plate electrode which is disposed in the first trench and a second portion of the insulating film which is disposed between the impurity doped region and the first portion of the plate electrode, wherein a second capacitor for said data storage portion is formed by the impurity doped region, a second portion of the plate electrode which is disposed in the second trench and a second portion of the insulating film which is disposed between the impurity doped region and the second portion of the plate electrode, and further wherein the second trench isolates data stored in the first capacitor from data storage portions of other memory cells, and
   switches formed for each of said memory cells to connect each memory cell to a data line, wherein each switch includes an MOS transistor having one of a source electrode or a drain electrode connected to the impurity region of said data storage portion and having a gate electrode connected to said word line.

2. A semiconductor memory comprising:
   a plurality of word lines, data lines and memory cells that are disposed on a semiconductor substrate of a first conductivity type, wherein said memory cells are arranged in matrix;
   data storage portions formed for each of said memory cells, wherein each of said data storage portions comprises:
      first and second trenches formed in said substrate;
      an impurity doped region having a second conductivity type opposite to said first conductivity type, wherein said impurity doped region is formed in said substrate so as to extend between a side wall of the first trench and a side wall of said second trench;
      an insulating film formed on said side wall of said second trench; and
      a plate electrode disposed on said insulating film in said second trench,
      wherein a capacitor for said data storage portion is formed by said impurity doped region, said insulating film and said plate electrode;
   switches formed for each of said memory cells to connect each memory cell to a data line, wherein each switch includes an MOS transistor having one of a source electrode or a drain electrode connected to the impurity region of said data storage portion, and having a gate electrode connected to said word line,
   wherein said memory cells include at least first and second memory cells connected to said data lines which first and second memory cells are adjacent to one another and wherein the first trenches of said first and second memory cells are surrounded by said second trench,
   wherein the first and second memory cells are connected to the same data line, and
   wherein said second trench isolates data stored in said capacitors of said first and second memory cells from data storage portions of other memory cells.

3. A capacitor structure comprising:
   first and second trenches formed in a semiconductor substrate of a first conductivity type;
   an impurity doped region having a second conductivity type opposite to said first conductivity type formed to extend between a side wall of the first trench and a side wall of said second trench;
   at least one insulating film formed on said side walls of said first and second trenches; and
   a plate electrode disposed on said insulating film in both said first and second trenches,
   wherein a first capacitor is formed by the impurity doped region, a first portion of the plate electrode which is disposed in the first trench and a first portion of the insulating film which is disposed between the impurity region and the first portion of the plate electrode, wherein a second capacitor is formed by the impurity doped region, a second portion of the plate electrode which is disposed in the second trench and a second portion of the insulating film which is disposed between the impurity doped region and the second portion of the plate electrode, and further wherein the second trench isolates an electric charge stored in the first capacitor from other elements formed in said substrate.

4. A capacitor structure comprising:
   a pair of first trenches formed in a semiconductor substrate of a first conductivity and spaced apart from one another by a predetermined distance;
   a second trench formed in said substrate and having a first portion to separate said first and second trenches from each other and having a second portion to surround said pair of first trenches;
   a first impurity doped region of a second conductivity type opposite to said first conductivity type formed between a side wall of said first trench and one side wall of said first portion of said second trench;
   a second impurity doped region of said second conductivity type formed between a side wall of the other of said first trenches and another side wall of said first portion of said second trench;
   an insulating film formed to cover said side walls of said first and second portions of said second trench; and
   a plate electrode formed to cover said insulating film formed over said side walls of said second trench;

wherein said second trench surrounds said first and second impurity doped regions, wherein a first capacitor is formed by said first impurity doped region, a portion of the insulating film formed over said one side wall of said first portion of said second trench and said plate electrode, wherein a second capacitor is formed by said second impurity doped region, a portion of the insulating film formed over said another side wall of said first portion of said second trench and said plate electrode, and wherein said second portion of said second trench isolates said first and second capacitors from other capacitors formed in said substrate.

5. A semiconductor memory according to claim 1 wherein said memory cells are at least two memory cells connected to said data lines and are adjacent to one another via said second trench, and the other memory cell is connected to the same data line.

6. A semiconductor memory according to claim 2 wherein said first trench is formed in such a manner as to be shallower than said second trench.

7. A semiconductor memory according to claim 5 wherein said first and second trenches have the same depth, and an impurity region having the same conductivity type to that of said substrate and having a high impurity concentration is formed on the bottom of said second trench.

8. A semiconductor memory according to claim 7 wherein an impurity region having the same conductivity type to that of said substrate and having a high impurity concentration is formed at at least a part of the portions which is deeper than the source and drain regions of said MOS transistor but is shallower than said first trench, inside a region in which said MOS transistor is disposed.

9. A capacitor structure according to claim 4, wherein said first and second impurity doped regions are formed to extend into contact with a side wall of said second portion of said second trench.

10. A semiconductor memory according to claim 1, wherein said impurity doped region is a diffused region formed by diffusing an impurity from the side wall of the first trench to extend to reach the side wall of the second trench.

11. A semiconductor memory according to claim 2, wherein said impurity doped region is a diffused region formed by diffusing an impurity from the side wall of the first trench to extend to reach the side wall of the second trench.

* * * * *